United States Patent
Reder et al.

(12) 
(10) Patent No.: US 6,927,177 B2
(45) Date of Patent: Aug. 9, 2005

(54) CHEMICAL MECHANICAL ELECTROPOLISHING SYSTEM

(75) Inventors: Steven E. Reder, Boring, OR (US); Michael J. Berman, West Linn, OR (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/693,110

(22) Filed: Oct. 24, 2003

(65) Prior Publication Data

US 2005/0090121 A1 Apr. 28, 2005

(51) Int. Cl.[7] .................... H01L 21/31; H01L 21/469
(52) U.S. Cl. ................................ 438/778; 438/907
(58) Field of Search .......................... 438/622, 631, 438/691, 778, 907, 974

(56) References Cited

U.S. PATENT DOCUMENTS

| | | | |
|---|---|---|---|
| 6,096,648 A | 8/2000 | Lopatin et al. | |
| 6,220,336 B1 * | 4/2001 | Smith | 164/453 |
| 6,242,343 B1 | 6/2001 | Yamazaki et al. | |
| 6,285,035 B1 | 9/2001 | Taravade | |
| 6,315,883 B1 | 11/2001 | Mayer et al. | |
| 6,319,836 B1 * | 11/2001 | Dunton et al. | 438/691 |
| 6,368,190 B1 | 4/2002 | Easter et al. | |
| 6,739,953 B1 * | 5/2004 | Berman et al. | 451/41 |
| 6,767,428 B1 * | 7/2004 | Gotkis et al. | 156/345.12 |

* cited by examiner

*Primary Examiner*—Phuc T. Dang
(74) *Attorney, Agent, or Firm*—Luedeka, Neely & Graham, P.C.

(57) ABSTRACT

A system for thinning a layer on a substrate without damaging a delicate underlying layer in the substrate. The system includes means for mechanically eroding the layer on the substrate, and means for electropolishing the layer on the substrate. In this manner, portions of the layer that cannot be removed by electropolishing can be removed by the mechanical erosion. However, electropolishing can preferentially be used on some portions of the layer so that unnecessary mechanical stresses can be avoided. Thus, the system imparts less mechanical stress to the substrate during the removal of the layer, and the delicate underlying layer receives less damage during the process, and preferably no damage whatsoever.

13 Claims, 3 Drawing Sheets

CHEMICAL MECHANICAL ELECTROPOLISHING SYSTEM

FIELD

This invention relates to the field of integrated circuit fabrication. More particularly, this invention relates to thinning the layers that are formed during the fabrication of integrated circuits.

BACKGROUND

As integrated circuits have become increasingly smaller, electrically conductive structures within the integrated circuits are placed increasingly closer together. This situation tends to enhance the inherent problem of parasitic capacitance between adjacent electrically conductive structures. Thus, new electrically insulating materials have been devised for use between electrically conductive structures, to reduce such capacitance problems. The new electrically insulating materials typically have lower dielectric constants, and thus are generally referred to as low k materials. While low k materials help to resolve the capacitance problems described above, they unfortunately tend to introduce new challenges.

Low k materials are typically filled with small voids that help reduce the material's effective dielectric constant. Thus, there is less of the material itself within a given volume, which tends to reduce the structural strength of the material. The resulting porous and brittle nature of such low k materials presents new challenges in both the fabrication and packaging processes. Unless special precautions are taken, the robustness and reliability of an integrated circuit that is fabricated with low k materials may be reduced from that of an integrated circuit that is fabricated with traditional materials, because low k materials differ from traditional materials in properties such as thermal coefficient of expansion, moisture absorption, adhesion to adjacent layers, mechanical strength, and thermal conductivity.

Low k materials are typically more brittle and have a lower breaking point than other materials. One reason for this is the porosity of the low k material, where a significant percentage of its physical volume is filled with voids. Thus, integrated circuits containing low k materials are inherently more prone to breaking or cracking during processes where physical contact is made with the integrated circuit surface, such as wire bonding and electrical probing, or processes that cause bending stresses such as mold curing, underfill curing, solder ball reflow, chemical mechanical polishing, or temperature cycling.

As integrated circuits have become smaller, they have shrunk not only in the amount of surface area required by the circuit, but also in the thicknesses of the various layers by which they are formed. As the thicknesses of the layers has decreased, it has become increasingly important to planarize a given layer prior to forming a subsequent overlying layer. One of the methods used for such planarization is called chemical mechanical polishing. During chemical mechanical polishing, the surface of the layer to be planarized, thinned, or both is brought into contact with the surface of a polishing pad. The pad and the substrate are rotated and translated relative to each other in the presence of a polishing fluid, which typically contains both physical erosion particles and chemical erosion compounds.

Unfortunately, the need to planarize the layers of an integrated circuit using traditional chemical mechanical polishing has become a problem, because the amount of down force and friction required to adequately erode a layer using chemical mechanical polishing has become great enough to crush, shear, or otherwise damage the increasingly delicate underlying low k layers as they are reduced in thickness with the general reduction in the size of integrated circuits.

For example, in copper dual damascene processing, there is a step to remove unwanted portions of a deposited copper layer from an upper surface of an integrated circuit. New integrated circuit designs place delicate low k layers somewhere beneath the copper layer to be removed. Traditional chemical mechanical polishing processes tend to be too rough during the removal of the copper layer, and damage the low k layer. Electropolishing is a more gentle method than chemical mechanical polishing, and has also been used to remove electrically conductive layers, such as copper. However, electropolishing tends to be unable to break through the oxidation on the surface of the copper layer, and thus is also inadequate for removing the copper layer. In addition, electropolishing also tends to not be able to remove the barrier layer and seed layer that often underlie the copper layer.

There is a need, therefore, for a new system for use in integrated circuit fabrication, which helps to alleviate one or more of the challenges mentioned above, and enables layers within an integrated circuit to be planarized or otherwise removed without damaging delicate underlying layers.

SUMMARY

The above and other needs are met by a system for thinning a layer on a substrate without damaging a delicate underlying layer in the substrate. The system includes means for mechanically eroding the layer on the substrate, and means for electropolishing the layer on the substrate.

In This manner, portions of the layer that cannot be removed by electropolishing can be removed by the mechanical erosion. However, electropolishing can preferentially be used on some portions of the layer so that unnecessary mechanical stresses can be avoided. Thus, the system imparts less mechanical stress to the substrate during the removal of the layer, and the delicate underlying layer receives less damage during the process, and preferably no damage whatsoever.

In various embodiments, the means for mechanically eroding the layer and the means for electropolishing the layer are configured to operate simultaneously. Preferably, the means for mechanically eroding the layer includes any one or combination of a rotating polishing pad, a rotating brush, and a spray nozzle adapted to direct a spray of a solution towards the layer. The means for electropolishing the layer preferably includes means for establishing a voltage potential through an electrically conductive liquid between the layer on the substrate and the means for mechanically eroding the layer.

According to another aspect of the invention there is described a system for thinning a layer on a substrate without damaging a delicate underlying layer in the substrate. An electropolishing pad mechanically erodes the layer on the substrate. A power supply establishes a voltage potential through a bath of an electrically conductive liquid between the layer on the substrate and the electropolishing pad.

In various embodiments of this aspect of the invention, the voltage potential has a range of between about one tenth of one volt and about one hundred volts. In some embodiments the system also includes a brush for mechanically eroding the layer on the substrate, and a spray nozzle adapted to direct a spray of the electrically conductive liquid towards the layer.

According to another aspect of the invention there is described a method for thinning a layer on a substrate without damaging a delicate underlying layer in the substrate, where a first portion of the layer is mechanically eroded, and a second portion of the layer is electropolished.

In various embodiments of this aspect of the invention, the first portion of the layer is one or both of an overlying oxidized portion of the layer and an underlying portion of the layer that is formed of a material that cannot be removed by electropolishing. The second portion of the layer preferably includes a metal, and is most preferably copper. In one embodiment, the first portion of the layer is electropolished simultaneously with the mechanical erosion, and in another embodiment the second portion of the layer is mechanically eroded simultaneously with the electropolishing. Preferably, the layer includes a first electrically conductive layer, an underlying non electrically conductive barrier layer, and an intervening electrically conductive seed layer. The delicate underlying layer is preferably formed of a low k material. In one embodiment, the first portion of the layer is thinned to a relatively greater extent by mechanical erosion and is thinned to a relatively lesser extent by electropolishing, and the second portion of the layer is thinned to a relatively greater extent by electropolishing and is thinned to a relatively lesser extent by mechanical erosion.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
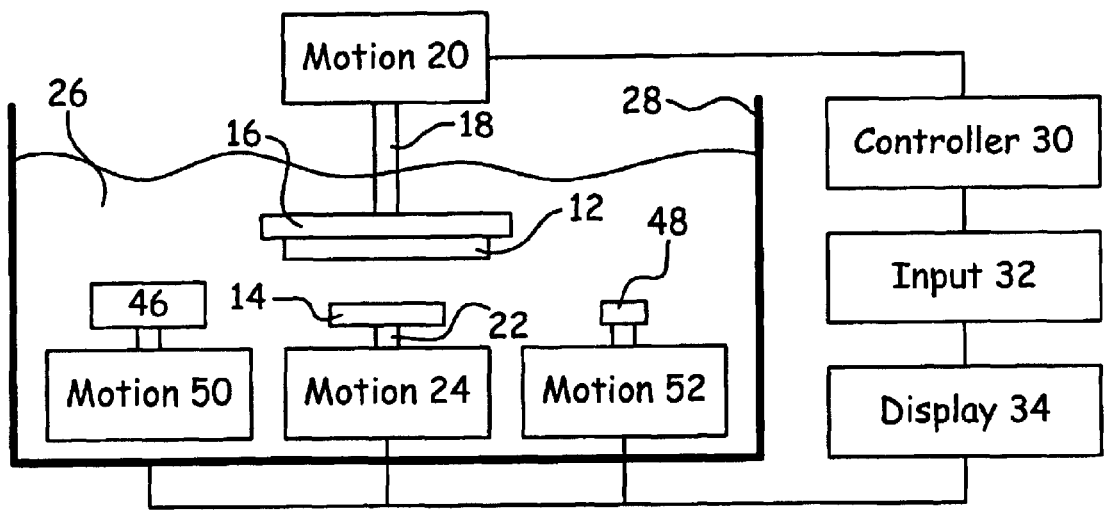
FIG. 1 is a functional block diagram of a chemical mechanical electropolishing system according to a preferred embodiment of the present invention.

With reference now to FIG. 1, there is depicted a functional block diagram of a chemical mechanical electropolishing system 10 according to a preferred embodiment of the invention. The system 10 differs in many important aspects from either a traditional chemical mechanical polishing system or an electropolishing system, which differing aspects enable the chemical mechanical electropolishing, or CME, system 10 to thin or remove layers, such as a copper layer, without damaging delicate underlying layers, such as low k layers. The system 10 is also capable of removing additional layers, such as barrier layers and seed layers, which often underlie the main layer to be remove.

Figure 2:
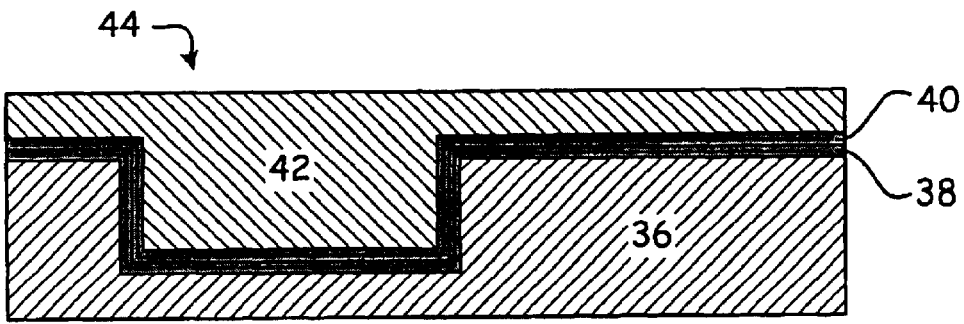
FIG. 2 is a cross sectional view of a portion of an integrated circuit on a substrate, depicting the layers to be removed, and the delicate underlying layer.

The system 10 is used for processing a substrate 12 on which integrated circuits are formed. The substrate 12 is preferably formed of a semiconducting material, such as of group IV materials like silicon, germanium, or silicon germanium, or group III–V materials such as gallium arsenide. However, in other embodiments the substrate 12 is an insulating substrate, such as alumina, sapphire, or glass. FIG. 2 is a cross sectional view of a portion of an integrated circuit including the substrate 12. A structure 44 has been formed in a layer 36 of the substrate 12, which layer 36 may be a low k layer, or a layer of another material which is delicate and easily damaged, as generally described above.

Figure 3:
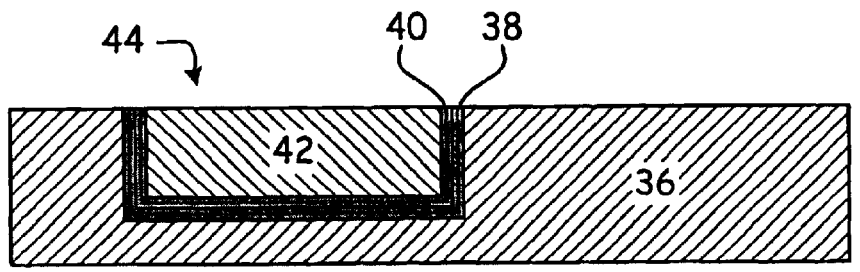
FIG. 3 is a cross sectional view of a portion of an integrated circuit on a substrate, depicting the delicate underlying layer and the structure that is formed after the layers have been removed.

The layer 36, in the example depicted in FIG. 2, is overlaid with a barrier layer 38, a seed layer 40, and a conductive layer 42, such as a copper layer. As can be seen, the barrier layer 38 and the seed layer 40 line the surfaces of the structure 44, and the conductive layer 42 fills the structure 44. However, it is desired to remove the layers 38, 40, and 42 from the upper surfaces of the layer 36, to produce the structure 44 as depicted in FIG. 3. It is this process of removing those upper portions of the layers 38, 40, and 42 where prior processing methods have proven to be inadequate, either by not completely removing the layers, or by damaging the delicate layer 36 in the process of such removal. The system 10 as depicted in FIG. 1 is adapted to remove the layers 38, 40, and 42, while reducing and preferably eliminating these problems. FIGS. 2 and 3 depict a single damascene structure. However, it is appreciated that the embodiments of the invention as described herein are equally applicable to dual damascene and other structures.

The substrate 12 is preferably retained by a carrier 16, which most preferably provides a rigid support across the entire back surface of the substrate 12. Thus, the front surface of the substrate 12, or in other words the surface of the substrate 12 on which the layers 38, 40, and 42 are formed as depicted in FIG. 2, is presented for processing by the system 10. A method for making an electrical contact with the front surface of the substrate 12 is established but not shown. This contact is necessary for the electropolishing process to occur. The front surface of the substrate 12 is preferably applied against an electropolishing pad 14 during at least a portion of the processing. The electropolishing pad 14 is preferably different in many respects from a standard polishing pad that is used in tradition chemical mechanical polishing.

For example, the electropolishing pad 14 is preferably formed of a material that is similar to a standard polishing pad, with a conductive filler added. By reducing down force, less friction is developed between the electropolishing pad 14 and the substrate 12. By reducing the friction between the electropolishing pad 14 and the substrate 12 in this manner, there is less shearing force developed in the delicate layer 36, which tends to reduce the amount of damage sustained by the layer 36 during processing.

Most preferably, the substrate 12 is applied against the electropolishing pad 14 with a force that is reduced from that which is traditionally used for chemical mechanical polishing. By reducing the down force applied between the substrate 12 and the electropolishing pad 14, two benefits are realized. First, the friction is reduced between the substrate 12 and the electropolishing pad 14, which reduces the shearing force in the layer 36, and thereby reduces the amount of damage to the layer 36, as described above. Second, the crushing force applied to the layer 36 is also reduced, which further reduces the amount of damage sustained by the layer 36 during the process. In addition, reducing the amount of down force used during processing of the substrate 12 tends to reduce the amount of dishing and erosion that occurs within the structure 44.

In a standard chemical mechanical polishing process, the amount of down force applied between the polishing pad and the substrate is between about four pounds per square inch and about nine pounds per square inch. In the preferred embodiments of the present invention, the down force between the electropolishing pad 14 and the substrate 12 is reduced to be less than about four pounds per square inch, and in a most preferred embodiment is about one and one half pounds per square inch.

In addition, the electropolishing pad 14 is preferably electrically conductive. In this manner, an electrical potential can be applied through the electropolishing pad 14, such as by using the electropolishing pad 14 as an electrode, in a manner that is described in more detail hereafter. Further, in one embodiment of the invention, the electropolishing pad 14 is fabricated to have a presented surface area that is smaller than the surface area of the substrate 12 that is presented for processing. One example of this is an electropolishing pad 14 that is circular, and which has a smaller diameter than the generally circular substrate 12 with which it is used. In some embodiments the processing surface area of the electropolishing pad 14 is between about twenty percent and about fifty percent of the processing surface area of the substrate 12. However, a standard size electropolishing pad 14 could also be used. A typical chemical mechanical polishing pad has a processing surface area that ranges from about twenty-five percent larger than the processed surface area of the substrate 12, to about fifteen times the surface area of the substrate 12. Thus, a typical chemical mechanical polishing pad is usually much larger than the surface of the substrate 12 that it is used to process.

However, by reducing the surface area of the electropolishing pad 14 to be less than the surface area of the substrate 12 which it is used to process, the total amount of friction generated between the electropolishing pad 14 and the substrate 12 is reduced. As described above, this further reduction in the amount of friction generated between the electropolishing pad 14 and the substrate 12 tends to reduce the amount of shearing force that is generated within the layer 36, and thus tends to reduce the amount of damage that is sustained by the layer 36 during processing in the system 10.

The electropolishing pad 14 is preferably mechanically connected to a motion controller 24, such as by a spindle 22 or other means. In this manner the motion controller 24 enables the electropolishing pad 14 to be moved in a variety of ways. For example, the electropolishing pad 14 can be oscillated, such as in an X or Y direction, or a combination of the two, or along other nonrectilinear axes. Further, the electropolishing pad 14 can be rotated, such as around the spindle 22. In addition, the entire electropolishing pad 14 can be moved in an orbital motion, such as by translating the spindle 22 around the circumference of a circle, or along an irregular path, or along paths that change according to either a regular or a pseudorandom pattern. The electropolishing pad 14 can also be caused to vibrate, such as with an ultrasonic motion or other high speed motion. In this manner, the electropolishing pad 14 is preferably moved across the surface of the substrate 12 in an even manner, so that the removal of the layers 38, 40, and 42 is accomplished uniformly across the surface of the substrate 12.

The substrate 12 is also preferably moved relative to the electropolishing pad 14, such as by engagement with a spindle 18 between the carrier 16 and a motion controller 20.

The substrate 12 can preferably be moved in all of the same ways as those described above in regard to the electropolishing pad 14. For example, the substrate 12 can preferably be oscillated, such as in an X or Y direction, or a combination of the two, or along other nonrectilinear axes. Further, the substrate 12 can be rotated, such as around the spindle 18. In addition, the entire substrate 12 can be moved in an orbital motion, such as by translating the spindle 18 around the circumference of a circle, or along an irregular path, or along paths that change according to either a regular or a pseudorandom pattern. The substrate 12 can also be caused to vibrate, such as with an ultrasonic motion or other high speed motion.

Most preferably there is some amount of relative motion that is produced by the substrate 12's motion controller 20, and some amount of relative motion that is produced by the electropolishing pad 14's motion controller 24. However, it is appreciated that in various embodiments it is possible to produce the relative motion using only one of the motion controller 20 and the motion controller 24, in which case the other motion controller could be omitted from the system 10 design. In a most preferred embodiment, a different motion set is produced by each of the motion controllers 20 and 24. For example, the motion controller 20 could cause the substrate 12 to rotate around the axis of the spindle 18 or other connection means, while the motional controller 24 causes the electropolishing pad 14 to rotate about the spindle 22 and orbit across the entire surface area of the substrate 12. Other such combinations of relative motion are also comprehended herein.

In a most preferred embodiment, at least one component of the relative motion between the substrate 12 and electropolishing pad 14 is at a speed that is dramatically greater from that which is traditionally used for chemical mechanical polishing. One purpose for this is to increase the rate at which material is removed from the surface of the substrate 12. Without being bound by theory, the rate of material removal is generally proportional to the force exerted or the friction generated between the substrate 12 and electropolishing pad 14, and the relative speed of motion between the surfaces of the substrate 12 and the electropolishing pad 14. As the force and friction between the substrate 12 and the electropolishing pad 14 are generally reduced when processed on the system 10 as described herein, the rate of material removal is preferably enhanced or otherwise compensated for by increasing the speed of relative motion. Most preferably, the electropolishing pad 14 is rotated at a speed of between about one hundred rotations per minute and about six hundred rotations per minute. Smaller diameter electropolishing pads 14 are most preferably rotated at the higher speed and larger diameter electropolishing pads 14 are most preferably rotated at the lower speed.

The substrate 12 and the electropolishing pad 14 are preferably brought into contact in the presence of an abrasive electrolyte 26 that is held by the system 10, such as within a bath 28. In other embodiments the abrasive electrolyte 26 may also be introduced by a spray or stream, as described in more detail hereafter. The abrasive electrolyte 26 is different from a standard chemical mechanical polishing solution or rouge in a variety of important respects. For example, the abrasive electrolyte 26 is designed to be both electrically conductive and mechanically abrasive. The abrasive electrolyte 26 may also be chemically abrasive to some degree.

Although some chemical mechanical polishing solutions may be water based, or based on some other electrically conductive fluid, the abrasive electrolyte 26 is different from these solutions, in that it does not contain impurities which prohibit or otherwise inhibit or degrade an electrolytic oxidation or other removal of the electrically conductive layer 42, which is most preferably copper. Typical polishing solutions are filled with materials that would tend to plate out or otherwise degrade such a reaction. However, the abrasive electrolyte 26 is preferably free of such materials, and other materials which would tend to oxidize, reduce, or otherwise react at the voltage potentials desired for the oxidation reaction that can be used to help remove the conductive layer 42.

Further, the abrasive electrolyte 26 preferably includes abrasive particles. The abrasive particles are preferably inert to the other reactions, both electrical and chemical, which may be occurring within the bath 28. Most preferably, the abrasive particles have a size of between about fifty nanometers and about two hundred and fifty nanometers in average diameter. Thus, the abrasive particles within the abrasive electrolyte 26 are preferably similar to the abrasive particles found within a slurry used for chemical mechanical polishing.

Further, in a preferred embodiment, both the substrate 12 and the electropolishing pad 14 are entirely contained within the bath 28 of the abrasive electrolyte 26. In this manner an electrical potential can preferably be established between the substrate 12, such as by way of the carrier 16, and the electropolishing pad 14, such as by way of the spindle 22 or other backing element. Thus, the substrate 12 and the electropolishing pad 14 are preferably used as electrodes during at least a portion of the processing of the substrate 12, and the abrasive electrolyte 26 acts as the current carrying medium between the electrode substrate 26 and the electrode electropolishing pad 14.

It is appreciated that the electrical potential applied between the substrate 12 and the electropolishing pad 14 can be sustained without there being a complete bath 28 of the abrasive electrolyte 26. Thus, in other embodiments there is some amount of the abrasive electrolyte 26 introduced between the substrate 12 and the electropolishing pad 14, but not an amount sufficient to immerse both the substrate 12 and the electropolishing pad 14. However, in the most preferred embodiment the substrate 12 and the electropolishing pad 14 are both substantially immersed in the abrasive electrolyte 26 during at least a portion of the processing, such as when an electrical potential is applied between the two.

The entire operation of the system 10 is preferably controlled by a controller 30, which may be remotely located, but is preferably local to the rest of the system 10. The controller 30 preferably controls parameters such as, but not limited to, the pressure or down force between the substrate 12 and either the brush 46 or the electropolishing pad 14, the pressure of the spray 48, the speed and type of the relative motion between the substrate 12 and any one of the electropolishing pad 14, the brush 46, and the spray 48, the electrical potential between the substrate 12 and either the electropolishing pad 14 or the brush 46, and which of the electropolishing pad 14, brush 46, and spray 48 to use at any given time, if any, and for how long.

Input such as for the programming of the system 10 is preferably received through an input 32, which may include such devices as a keyboard, a pointing device such as a mouse or joystick, and a network interface such as can be used for receiving programming and other instructions across a computer network. Most preferably the system 10 also includes a display 34 of some type, upon which information in regard to the programming, processing, and progress of the system 10 can be presented.

There are many modes in which the system 10 can operate, which modes preferably depend at least in part upon the materials, thicknesses, and other properties of the layers such as 38, 40, and 42 that are to be removed from the surface of the substrate 12, and the nature of the underlying delicate layers, such as 36. Thus, any specific embodiments described herein are not intended to be limitations on all possible embodiments of the system 10 or its use.

For example, in the case where the conductive layer 42 is a copper layer, and the underlying layer 36 is a delicate low k layer, there are many challenges to be overcome, as described above. The system 10 overcomes these challenges by way of its unique capabilities. For example, to remove the oxide that tends to form on the surface of the copper layer 42, and which tends to inhibit the use of electropolishing, the electropolishing pad 14 can be brought into contact with the surface of the substrate 12 for a period of time and with a down force that is just sufficient to remove the oxidation. At that point in time, the down force between the substrate 12 and the electropolishing pad 14 can be reduced, or the contact between the substrate 12 and the electropolishing pad 14 can be removed altogether.

Then a potential can be applied between the substrate 12 and the electropolishing pad 14, so that the copper conductive layer 42 is removed by an oxidation or other reaction, such as etching by an acidic abrasive electrolyte. When the copper conductive layer 42 is substantially removed, the electropolishing pad 14 can again be brought in to contact with the substrate 12, or the down force between the electropolishing pad 14 and the substrate 12 can be increased. In this manner, any remaining portions of the seed layer 40, and the barrier layer 38, which is typically formed of a nonconductive material, can be removed, yielding the structure 44 as depicted in FIG. 3.

It is appreciated that there are many permutations and combinations of steps such as those described in the specific example above, which can be used to planarize or otherwise remove various layers from the surface of the substrate 12 while reducing or eliminating the damage to the delicate underlying layers, such as layer 36. The system 10 tends to reduce such damage by reducing the amount of down force that is required for processing, and reducing the friction between the substrate 12 and the electropolishing pad 14. Further, the system 10 makes use of electrochemical processing to erode the electrically conductive layers, thus further reducing or eliminating the need for contact between the substrate 12 and the electropolishing pad 14, which further preserves the integrity of the delicate layers such as layer 36.

In alternate embodiments of the system 10, a brush 46 is used either in addition to or in place of the electropolishing pad 14. For example, the brush 46 may replace the electropolishing pad 14. Alternately, either the electropolishing pad 14 can be moved away from the substrate 12 to allow room for the brush 46 to be used, or the substrate 12 can be moved away from the electropolishing pad 14 to be adjacent the brush 46. The brush 46 may be able to better remove specific layers, or better remove layers from different structures of the integrated circuit than the electropolishing pad 14. For example, a brush 46, because of its generally reduced amount of surface contact, relative to the electropolishing pad 14, will tend to induce lesser forces within the substrate 12. The brush 46 may be one or more of a rolling brush or a rotating brush, or may have some other type of relative motion, produced by a motion controller 50 for example, such as is described above in regard to the motion of the substrate 12 and the electropolishing pad 14.

Similarly, a spray 48 may also be used, either in some combination with the electropolishing pad 14 and the brush 46, or as a replace for one or both of the electropolishing pad 14 and the brush 46. For example, the electropolishing pad 14 or the brush 46 can be moved away from the substrate 12 to allow room for the spray 48 to be used, or the substrate 12 can be moved away from the electropolishing pad 14 or the brush 46 to be adjacent the spray 48. The spray 48 preferably sprays the abrasive electrolyte 26 against the surface of the substrate 12. In preferred embodiments, the level of the bath 28 is reduced when the spray 48 is used, so that the bath 28 of the abrasive electrolyte 26 does not impede the force of the spray 48.

The spray 48 may also take one or more of a variety of different forms. For example, the spray 48 may be pulsated, such as with an ultrasonic or other frequency. Further, the spray 48 may be oscillated, spun, or otherwise moved relative to the surface of the substrate 12, such as with one or more of the motions described above in regard to the substrate 12 and the electropolishing pad 14. In addition, the spray 48 may be a single jet or multiple jets, and may in different embodiments be directed from a single angle toward the substrate 12, an adjustable or varying angle, or from a variety of simultaneous angles. The spray 48 may also have some other type of relative motion, produced by a motion controller 52 for example, such as is described above.

In some embodiments, the use of the spray 48 or the brush 46 may be preferred over the use of the electropolishing pad 14 at different points during the processing of the substrate 12. For example, the spray 48 or brush 46 could be used during removal of a surface oxidation from the conductive layer 42, or during the removal of one or both of the seed layer 40 and the barrier layer 38, or even to increase the rate of material removal during the electropolishing of the conductive layer 42, in a manner that is more gentle than the application of the electropolishing pad 14.

In other embodiments, all three of the electropolishing pad 14, the brush 46, and the spray 48 are used during the processing of the substrate 12. For example, the spray 48 may be used simultaneously with either the electropolishing pad 14 or the brush 46. Alternately, the electropolishing pad 14, the brush 46, and the spray 48 can be separately used at different points in the processing of the substrate 12, such as when the particular attributes of a given one of the electropolishing pad 14, the brush 46, and the spray 48 are most suitable for removal of a given portion of the layers 38, 40, and 42, such as removing an oxide from the surface, removing the conductive layer 42, removing one or both of the seed layer 40 and the barrier layer 38, or cleaning off the surface of the layer 36 to ensure than no remaining traces of the removed materials are left behind. In this embodiment, all three of the electropolishing pad 14, the brush 46, and the spray 48 are present in the system 10.

Figure 4:
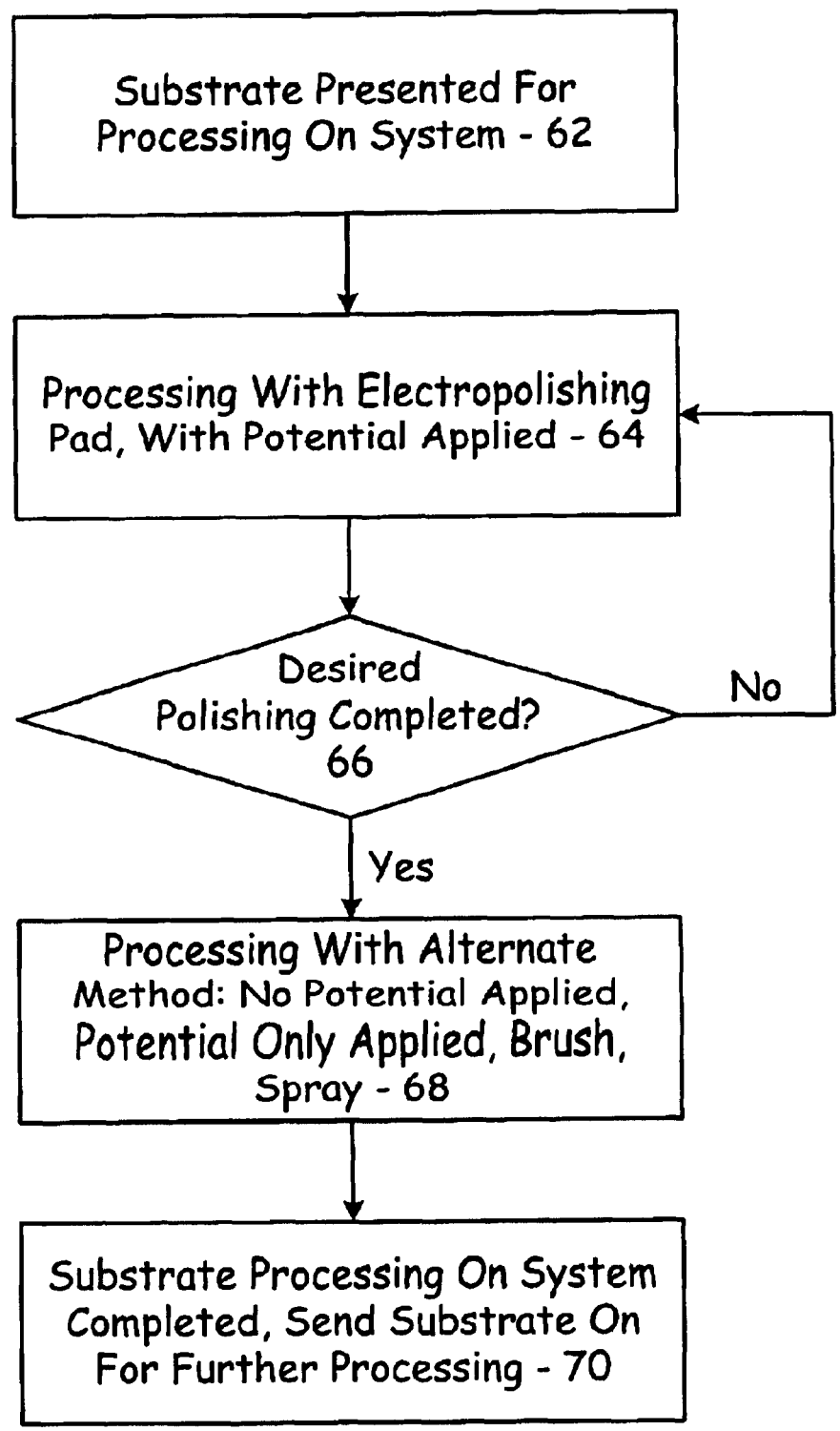
FIG. 4 is a flow chart of a first embodiment of a method of processing a substrate with a system according to the present invention.
Figure 5:
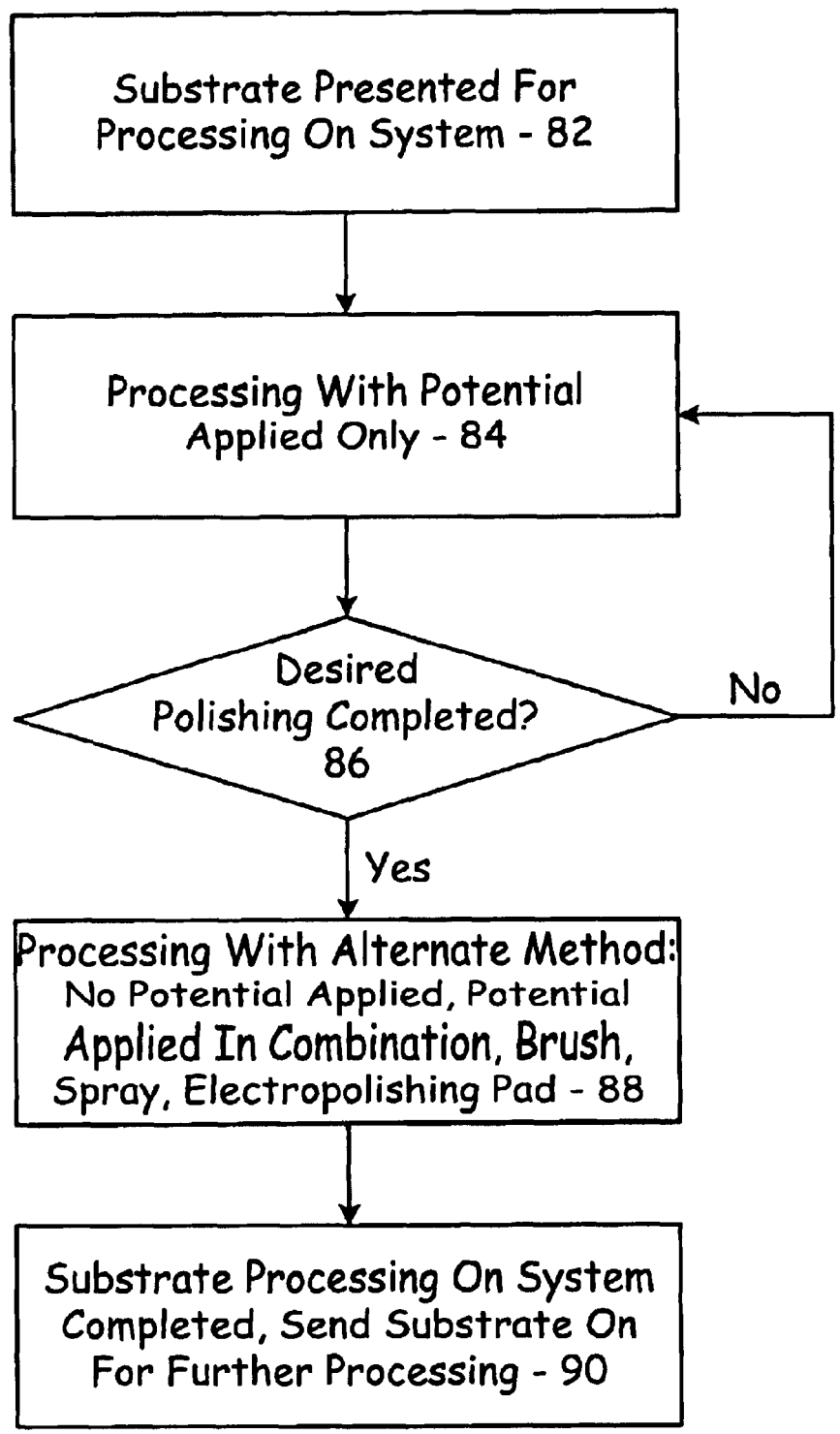
FIG. 5 is a flow chart of a second embodiment of a method of processing a substrate with a system according to the present invention.

FIGS. 4 and 5 depict flow charts for two additional possible processing flows 60 and 80, which are presented by way of example. In FIG. 4, process 60 starts when a substrate 12 is presented for processing on the system 10, as given in block 62. The substrate 12 is initially processed with the electropolishing pad 14 and with the potential applied, as given in block 64. The substrate 12 may be inspected periodically, as given in block 66, to determine whether the desired amount of processing has been performed. If not, then processing of the substrate 12 is continued as given in block 64. If so, then processing of the substrate 12 is completed by one or more of the other methods, such as given in block 68. The completed substrate 12 is delivered for further processing, as given in block 70, when all of the processing on system 10 has been completed.

Similarly, in FIG. 5, process 80 starts when a substrate 12 is presented for processing on the system 10, as given in block 82. The substrate 12 is initially processed with the electrolytic reaction between the substrate 12 and some other electrode, such as either the brush 46 or the electropolishing pad 14, as given in block 84, in which the abrasive electrolyte 26 is used as the conducting medium. The substrate 12 may be inspected periodically, as given in block 86, to determine whether the desired amount of processing has been performed. If not, then processing of the substrate 12 is continued as given in block 84. If so, then processing of the substrate 12 is completed by one or more of the other methods, such as given in block 88. The completed substrate 12 is delivered for further processing, as given in block 90, when all of the processing on system 10 has been completed.

The foregoing description of preferred embodiments for this invention has been presented for the purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A system for thinning a layer on a substrate without damaging a delicate underlying layer in the substrate, the system comprising:

means for mechanically eroding the layer on the substrate, wherein the means for mechanically eroding the layer comprise at least one of a rotating brush and a spray nozzle adapted to direct a spray of a solution against the layer, and means for electropolishing the layer on the substrate.

2. The system of claim 1, wherein the means for mechanically eroding the layer and the means for electropolishing the layer are configured to operate simultaneously.

3. The system of claim 1, wherein the means for electropolishing the layer comprise means for establishing a voltage potential through an electrically conductive liquid between the layer on the substrate and the means for mechanically eroding the layer.

4. A method for thinning an overlying layer on a substrate without damaging a delicate underlying layer in the substrate, the method comprising the steps of:

mechanically eroding a first portion of the overlying layer, and electropolishing a second portion of the overlying layer.

5. The method of claim 4, wherein the first portion of the layer comprises an overlying oxidized portion of the layer.

6. The method of claim 4, wherein the first portion of the layer comprises an underlying portion of the layer that is formed of a material that cannot be removed by electropolishing.

7. The method of claim 4, wherein the first portion of the layer comprises an overlying oxidized portion of the layer and an underlying portion of the layer that is formed of a material that cannot be removed by electropolishing.

8. The method of claim 4, wherein the second portion of the layer comprises a metal.

9. The method of claim 4, wherein the first portion of the layer is electropolished simultaneously with the mechanical erosion.

10. The method of claim 4, wherein the second portion of the layer is mechanically eroded simultaneously with the electropolishing.

11. The method of claim 4, wherein the layer comprises a first electrically conductive layer, an underlying non electrically conductive barrier layer, and an intervening electrically conductive seed layer.

12. The method of claim 4, wherein the layer comprises copper.

13. The method of claim 4, wherein the first portion of the layer is thinned to a relatively greater extent by mechanical erosion and is thinned to a relatively lesser extent by electropolishing, and the second portion of the layer is thinned to a relatively greater extent by electropolishing and is thinned to a relatively lesser extent by mechanical erosion.

* * * * *